(12) United States Patent
Suda

(10) Patent No.: US 7,908,110 B2
(45) Date of Patent: Mar. 15, 2011

(54) TEST DEVICE, TEST METHOD AND COMPUTER READABLE MEDIA

(75) Inventor: Masakatsu Suda, Tokyo (JP)

(73) Assignee: Advantest Corporation, Tokyo (JP)

( * ) Notice: Subject to any disclaimer, the term of this patent is extended or adjusted under 35 U.S.C. 154(b) by 290 days.

(21) Appl. No.: 12/177,169

(22) Filed: Jul. 22, 2008

(65) Prior Publication Data

US 2009/0228227 A1 Sep. 10, 2009

Related U.S. Application Data

(63) Continuation of application No. PCT/JP2007/050464, filed on Jan. 16, 2007.

(30) Foreign Application Priority Data

Jan. 25, 2006 (JP) .................................. 2006-016937

(51) Int. Cl.
 *G06F 19/00* (2006.01)
(52) U.S. Cl. ............. 702/125; 702/79; 702/72; 714/700
(58) Field of Classification Search .................... 702/58, 702/59, 71, 66, 70, 72, 73, 74, 75, 78, 79, 702/80, 108, 117, 118, 124–126, 185, 189, 702/178; 714/1–57; 327/147–162; 713/400, 713/401, 500–503, 600, 60
See application file for complete search history.

(56) References Cited

U.S. PATENT DOCUMENTS

| | | | |
|---|---|---|---|
| 7,099,424 B1 * | 8/2006 | Chang et al. | 375/370 |
| 2004/0122620 A1 * | 6/2004 | Doi et al. | 702/182 |
| 2005/0111602 A1 * | 5/2005 | Suda et al. | 375/355 |
| 2005/0193298 A1 * | 9/2005 | Inaba et al. | 714/726 |
| 2005/0249001 A1 * | 11/2005 | Tanaka et al. | 365/201 |

FOREIGN PATENT DOCUMENTS

| | | |
|---|---|---|
| JP | 06-148279 | 5/1994 |
| JP | 08-122409 | 5/1996 |

OTHER PUBLICATIONS

D.C.Keezer, D.Minier, M.Paradis, F.Binette, "Modular Extension of ATE to 5 Gbps," USA, 2004, International Test Conference 2004 (ITC2004), p. 748-757 (Paper 26.3).

\* cited by examiner

*Primary Examiner* — Mohamed Charioui
*Assistant Examiner* — Ricky Ngon
(74) *Attorney, Agent, or Firm* — Osha • Liang LLP

(57) ABSTRACT

Provided is a test apparatus, including a storage section that stores a count value for adjusting a phase of a sampling clock indicating a timing of acquiring an output signal of a DUT; a clock generating section that generates the sampling clock indicating the timing of acquiring the output signal, based on an offset corresponding to the count value and on a reference clock; a first delay section that outputs a first delay clock having a frequency equal to the frequency of the sampling clock and a preset phase difference in relation to the sampling clock, based on the reference clock and the offset; a phase detecting section that detects a phase difference between the first delay clock and a transition point of the output signal, and changes the count value in a direction that decreases the phase difference; a timing comparison section that acquires the output signal according to a transition timing of the sampling clock; and a judging section that judges acceptability of the acquired output signal by comparing the output signal to an expected value.

15 Claims, 5 Drawing Sheets

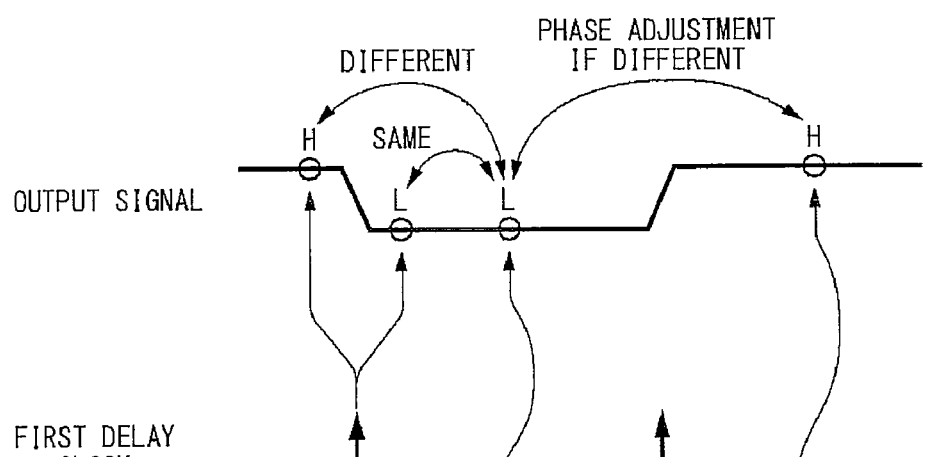
FIG. 3A OUTPUT SIGNAL
FIG. 3B FIRST DELAY CLOCK
FIG. 3C SECOND DELAY CLOCK
FIG. 3D SAMPLING CLOCK
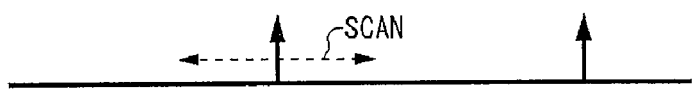

TEST DEVICE, TEST METHOD AND COMPUTER READABLE MEDIA

CROSS REFERENCE TO RELATED APPLICATION

This is a continuation application of PCT/JP 2007/050464 filed on Jan. 16, 2007 which claims priority from a Japanese Patent Application NO. 2006-016937 filed on Jan. 25, 2006, the contents of which are incorporated herein by reference.

TECHNICAL FIELD

The present invention relates to a test apparatus and a test method. In particular, the present invention relates to a test apparatus, a test method, and computer readable media for generating a sampling clock and acquiring a signal output by a device under test based on the timing of the generated sampling clock.

BACKGROUND ART

When testing a device under test that outputs a serial transmission signal, a conventional test apparatus performs a clock data recovery process on the output signal to generate a sampling clock timing in synchronization with the output signal. The test apparatus acquires the output signal from the device under test based on the generated sampling clock timing and judges acceptability of the output signal. The test apparatus may use a PLL (Phase Locked Loop) circuit for this clock data recovery process, as in, for example, D. C. Keezer, D. Minier, M. Paradis, F. Binette, "Modular Extension of ATE to 5 Gbps", USA, 2004, INTERNATIONAL TEST CONFERENCE 2004 (ITC2004), P 748-757 (Paper 26.3).

The PLL circuit, however, requires a long time to stabilize the frequency of the sampling clock. PLL circuits with high-speed responses include high-speed devices such as GaAs devices, and are therefore extremely expensive. Therefore, it is expensive for a conventional test apparatus to acquire an output signal with a high clock rate. Furthermore, the PLL circuit accumulates random jitter from the output signal, which affects the sampling clock. This makes it difficult to accurately acquire the output signal when a conventional test apparatus uses the PLL circuit for the clock data recovery process.

SUMMARY

Therefore, it is an object of an aspect of the innovations herein to provide a test apparatus, test method, and computer readable media, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary test apparatus may include a test apparatus that tests a device under test, including a storage section that stores a count value for adjusting a phase of a sampling clock indicating a timing of acquiring an output signal of the device under test; a clock generating section that generates the sampling clock indicating the timing of acquiring the output signal of the device under test, based on an offset corresponding to the count value and on a reference clock of the test apparatus; a first delay section that outputs a first delay clock having a frequency equal to the frequency of the sampling clock and a preset phase difference in relation to the sampling clock, based on the reference clock and the offset; a phase detecting section that has an input end connected to the device under test, an input end connected to an output side of the first delay section, and an output end connected to an input side of the storage section, the phase detecting section detecting a phase difference between the first delay clock and a transition point of the output signal of the device under test, and changing the count value in a direction that decreases the phase difference; a timing comparison section that has an input end connected to the device under test and an input end connected to an output end of the clock generating section, the timing comparison section acquiring the output signal of the device under test according to a transition timing of the sampling clock; and a judging section that has an input end connected to an output end of the timing comparison section, and that judges acceptability of the output signal of the device under test by comparing the output signal acquired by the timing comparison section to an expected value.

According to a second aspect related to the innovations herein, one exemplary test method may include a method for testing a device under test with a test apparatus, comprising the steps of storing a count value for adjusting a phase of a sampling clock indicating a timing of acquiring an output signal of the device under test; generating the sampling clock indicating the timing of acquiring the output signal of the device under test, based on an offset corresponding to the count value and a reference clock of the test apparatus; outputting a first delay clock having a frequency equal to the frequency of the sampling clock and a preset phase difference in relation to the sampling clock, based on the reference clock and the offset; detecting a phase difference between the first delay clock and a transition point of the output signal of the device under test, and changing the count value in a direction that decreases the phase difference; acquiring the output signal of the device under test according to a transition timing of the sampling clock; and judging acceptability of the output signal of the device under test by comparing the output signal acquired at the output signal acquiring step to an expected value.

According to a third aspect related to the innovations herein, one exemplary computer readable medium may include a computer readable medium storing thereon a program that, when executed, causes the computer to function as a storage module that stores a count value for adjusting a phase of a sampling clock indicating a timing of acquiring an output signal of the device under test; a clock generating module that generates the sampling clock indicating the timing of acquiring the output signal of the device under test, based on an offset corresponding to the count value and on a reference clock of the test apparatus; a first delay module that outputs a first delay clock having a frequency equal to the frequency of the sampling clock and a preset phase difference in relation to the sampling clock, based on the reference clock and the offset; a phase detecting module that detects a phase difference between the first delay clock and a transition point of the output signal of the device under test, and changes the count value in a direction that decreases the phase difference; a timing comparison module that acquires the output signal of the device under test according to a transition timing of the sampling clock; and a judging module that judges acceptability of the output signal of the device under test by comparing the output signal acquired by the timing comparison section to an expected value.

The summary clause does not necessarily describe all necessary features of the embodiments of the present invention. The present invention may also be a sub-combination of the

BRIEF DESCRIPTION OF THE DRAWINGS

FIG. 3A shows an example of the output signal; FIG. 3B shows an example of the first delay clock; FIG. 3C shows an example of the second delay clock; and FIG. 3D shows an example of the sampling clock.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
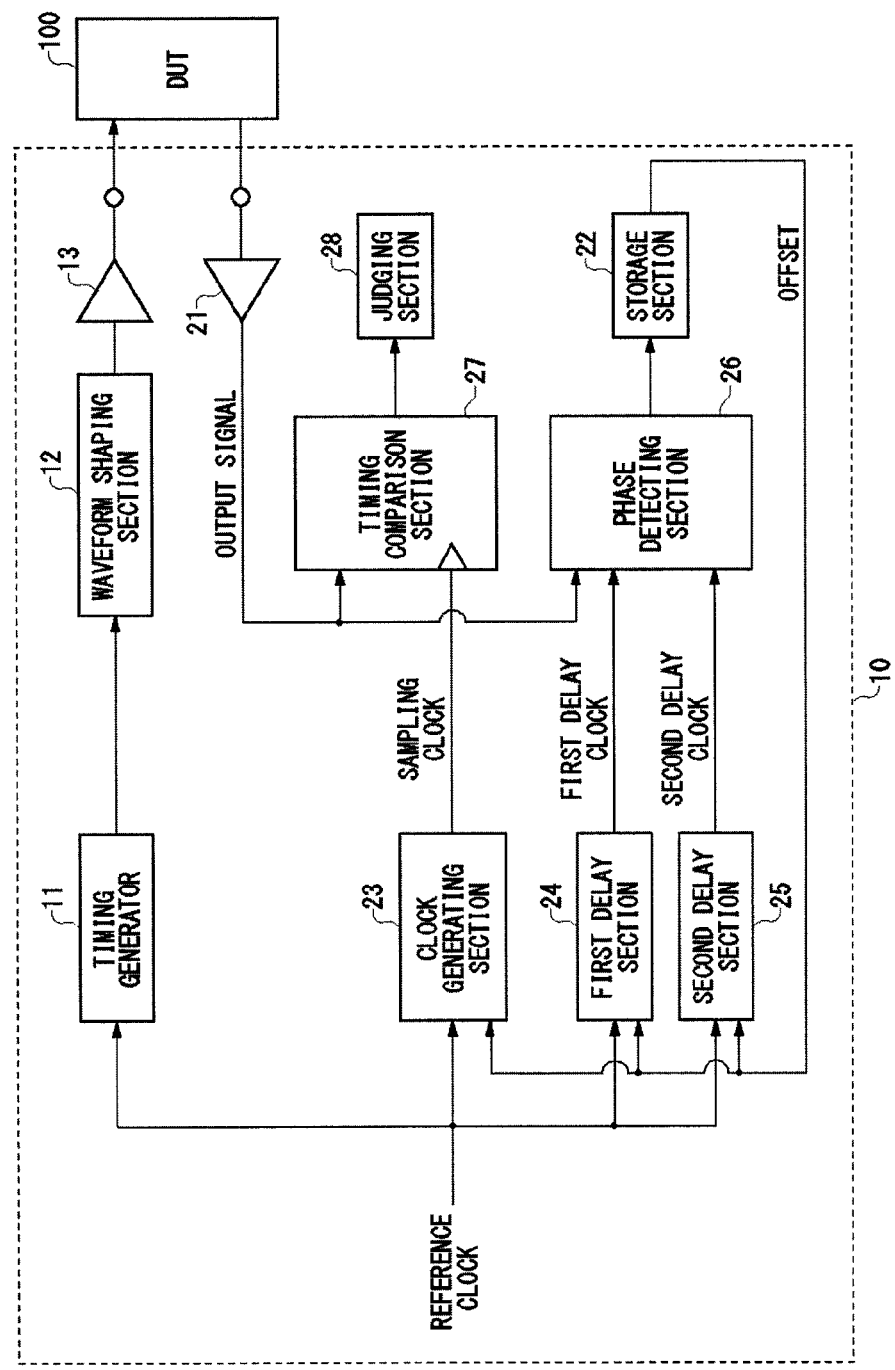
FIG. 1 shows a configuration of a test apparatus 10 according to the present embodiment along with a DUT 100.

FIG. 1 shows a configuration of a test apparatus 10 according to the present embodiment along with a device under test 100 (referred to hereinafter as a "DUT 100"). The test apparatus 10 performs a clock data recovery process on the output signal from the DUT 100 and generates a sampling clock in synchronization with the output signal. The test apparatus 10 acquires the output signal based on the timing of the generated sampling clock and judges acceptability of the output signal.

The test apparatus 10 is provided with a timing generator 11, a waveform shaping section 12, a driver 13, a level comparator 21, a storage section 22, a clock generating section 23, a first delay section 24, a second delay section 25, a phase detecting section 26, a timing comparison section 27, and a judging section 28. The timing generator 11 outputs a timing pulse generated based on a reference clock of the test apparatus 10. The waveform shaping section 12 generates a test signal based on the timing pulse. The driver 13 supplies the DUT 100 with the test signal generated by the waveform shaping section 12. The test apparatus 10 may be provided with a plurality of timing generators 11, waveform shaping sections 12, and drivers 13 to correspond with a plurality of input terminals of the DUT 100.

The level comparator 21 binarizes, with a prescribed level as a base, the signal output from the DUT 100 in response to the test signal. The storage section 22 stores therein a count value for adjusting the phase of the sampling clock that indicates the timing at which the output signal of the DUT 100 is acquired.

The clock generating section 23 generates the sampling clock based on an offset corresponding to the count value stored in the storage section 22 and the reference clock of the test apparatus 10. More specifically, the clock generating section 23 may generate the sampling clock based on the designated delay amount and the offset. The first delay section 24 outputs a first delay clock based on the offset corresponding to the count value stored in the storage section 22 and the reference clock. The first delay clock has the same frequency as the sampling clock and has a preset phase difference in relation to the sampling clock. The second delay section 25 outputs a second delay clock that has the same frequency as the first delay clock and has a preset phase difference of less than one cycle of the first delay clock, in relation to the first delay clock. For example, the second delay section 25 generates the second delay clock based on the offset corresponding to the count value stored in the storage section 22 and the reference clock.

The phase detecting section 26 detects the phase difference between the first delay clock and a transition point at which the output signal of the DUT 100 transitions. The phase detecting section 26 changes the count value in a direction that decreases the phase difference. For example, if the transition point of the output signal of the DUT 100 is ahead of the first delay clock, the phase detecting section 26 decreases the count value stored in the storage section 22. If the transition point of the output signal of the DUT 100 is behind the first delay clock, the phase detecting section 26 increases the count value stored in the storage section 22. The timing comparison section 27 acquires the output signal of the DUT 100 according to a transition timing of the sampling clock output from the clock generating section 23. The judging section 28 judges acceptability of the output signal of the DUT 100 by comparing the output signal acquired by the timing comparison section 27 to an expected value.

In this way, the test apparatus 10 can synchronize the sampling clock with the output signal by adjusting the phase of the sampling clock according to whether the transition point of the output signal is ahead of or behind the first delay clock. In other words, the test apparatus 10 can synchronize the sampling clock with the output signal through a clock data recovery process using a DLL (Delay Locked Loop).

The DLL process can generate a sampling clock that can quickly track the output signal without using a high-speed device. Therefore, the test apparatus 10 using the DLL process can quickly test the DUT 100 and can be configured cheaply. Furthermore, the DLL process can generate the sampling clock that can quickly track the output signal without accumulating the random jitter that results from using the PLL process. Therefore, the test apparatus 10 using the DLL process can accurately test the DUT 100.

Figure 2:
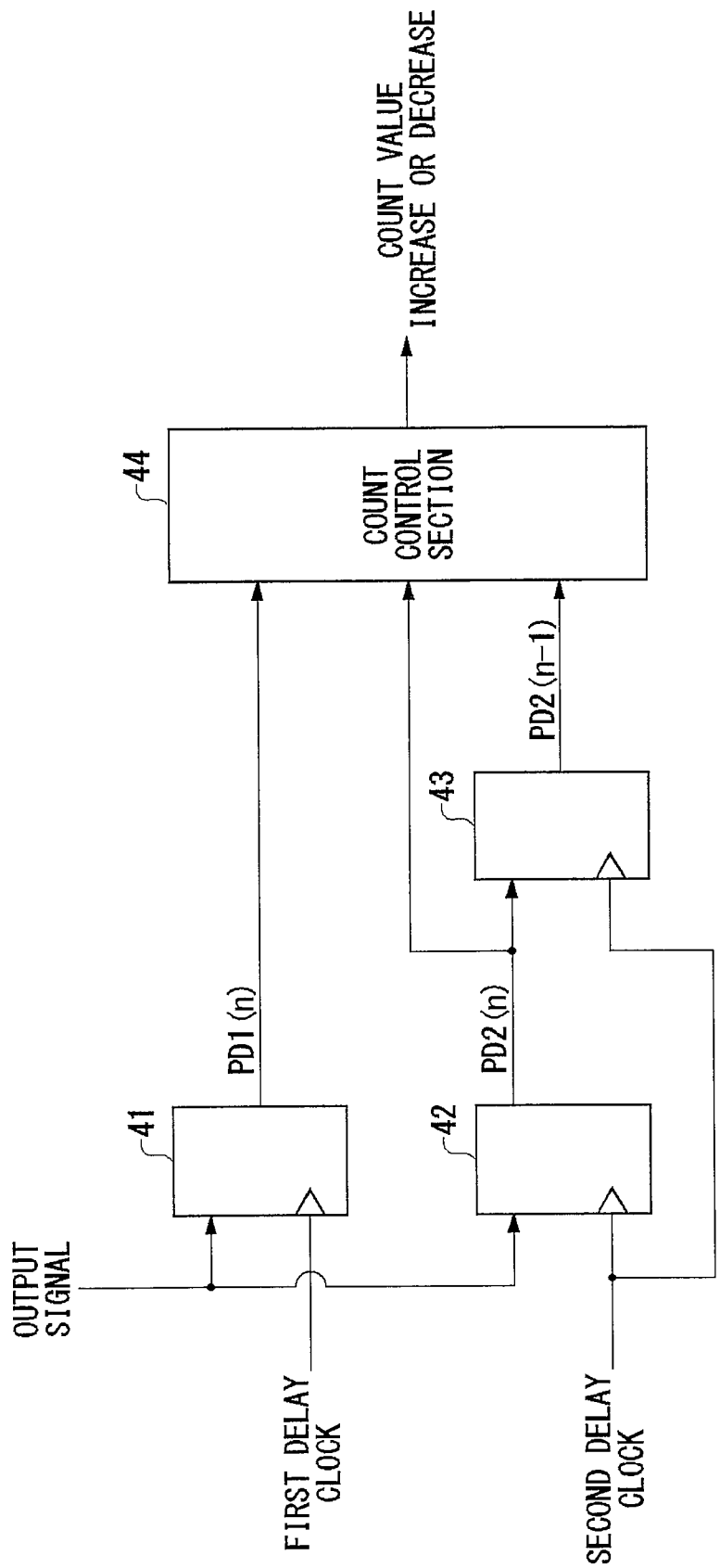
FIG. 2 shows an exemplary configuration of the phase detecting section 26.

FIG. 2 shows an exemplary configuration of the phase detecting section 26. The phase detecting section 26 may include a first flip-flop 41, a second flip-flop 42, a third flip-flop 43, and a count control section 44. The first flip-flop 41 acquires the output signal of the DUT 100 according to the transition timing of the first delay clock. The second flip-flop 42 acquires the output signal of the DUT 100 according to the transition timing of the second delay clock. The third flip-flop 43 acquires the signal value acquired by the second flip-flop 42, according to the transition timing of the second delay clock. In other words, the third flip-flop 43 acquires the signal value of the output signal of the DUT 100 at a previous cycle.

The count control section 44 increases the count value stored in the storage section 22 if the signal value acquired by the first flip-flop 41 is different than the signal value acquired by the second flip-flop 42, and decreases the count value stored in the storage section 22 if these values are the same.

The count control section 44 need not change the count value if the signal value acquired by the second flip-flop 42 is equal to the signal value acquired by the third flip-flop 43. In other words, regardless of whether the signal value acquired by the first flip-flop 41 is equal to the signal value acquired by the second flip-flop 42, the count control section 44 need not change the count value as long as the signal value acquired by the second flip-flop 42 is equal to the signal value acquired by the third flip-flop 43.

Table 1 shows an example of control performed by the count control section 44 for increasing and decreasing the count value. In Table 1, PD1(n) represents the signal value acquired by the first flip-flop 41, PD2(n) represents the signal value acquired by the second flip-flop 42, and PD2(n−1) represents the signal value acquired by the third flip-flop 43. As shown in Table 1, the second flip-flop 42 does not change the count value when PD2(n)=PD2(n−1). If PD2(n)≠PD2(n−1), the second flip-flop 42 increases the count value when PD1(n)≠PD2(n) and decreases the count value when PD1(n)=PD2(n).

TABLE 1

| PD1(n) | PD2(n) | PD2(n − 1) | count value increase/decrease |
|--------|--------|------------|-------------------------------|
| L | L | L | no change |
| L | L | H | decrease |
| L | H | L | increase |
| L | H | H | no change |
| H | L | L | no change |
| H | L | H | increase |
| H | H | L | decrease |
| H | H | H | no change |

FIGS. 3A to 3D show examples of the output signal, the first delay clock, the second delay clock, and the sampling clock. FIG. 3A shows the output signal, FIG. 3B shows the first delay clock, FIG. 3C shows the second delay clock, and FIG. 3D shows the sampling clock.

The first delay section 24 controls the timing of the first delay clock to be positioned near the transition points of the output signal. The second delay section 25 delays the second delay clock in relation to the first delay clock such that the phase difference therebetween becomes less than one cycle of the first delay clock. When the first delay clock and the second delay clock are in such a relationship, and if the signal value of the output signal acquired with the first delay clock timing is different than the signal value of the output signal acquired with the second delay clock timing, the first delay clock timing is positioned before the transition timing of the output signal. Accordingly, if the signal value of the output signal acquired with the first delay clock timing is different than the signal value of the output signal acquired with the second delay clock timing, the phase detecting section 26 may determine that the transition point of the output signal is behind the first delay clock.

On the other hand, if the signal value of the output signal acquired with the first delay clock timing is equal to the signal value of the output signal acquired with the second delay clock timing, the timing of the first delay clock is positioned after the transition timing of the output signal. Accordingly, if the signal value of the output signal acquired with the first delay clock timing is equal to the signal value of the output signal acquired with the second delay clock timing, the phase detecting section 26 may determine that the transition point of the output signal is ahead of the first delay clock.

If the transition point of the output signal is determined to be behind the first delay clock, the phase detecting section 26 increases the count value stored in the storage section 22. Increasing the count values causes the offset to increase, so that the first delay section 24 delays the phase of the first delay clock. At the same time, the clock generating section 23 and the second delay section 25 delay the phase of the sampling clock and the second delay clock by the same amount as each other.

If the transition point of the output signal is determined to be ahead of the first delay clock, the phase detecting section 26 decreases the count value stored in the storage section 22. Decreasing the count values causes the offset to decrease, so that the first delay section 24 increases the phase of the first delay clock. At the same time, the clock generating section 23 and the second delay section 25 increase the phase of the sampling clock and the second delay clock by the same amount as each other. In this way, the phase detecting section 26 can adjust the transition timing of the first delay clock to be the same as the transition timing of the output signal.

The phase detecting section 26 can detect whether the first delay clock is ahead of or behind the transition point of the output signal by comparing the signal value of the output signal acquired with the first delay clock timing and the signal value of the output signal acquired with the second delay clock timing. Therefore, the phase detecting section 26 can easily judge the phase relation between the transition point of the output signal and the first delay clock.

Instead of the method described above, the second delay section 25 may control the second delay clock to be ahead of the first delay clock and to have a phase difference of less than one cycle of the first delay clock, in relation to the first delay clock. In this case, if the signal value of the output signal acquired with the first delay clock timing is equal to the signal value of the output signal acquired with the second delay clock timing, the phase detecting section 26 determines that the transition point of the output signal is ahead of the first delay clock, and therefore decreases the count value. On the other hand, if the signal value of the output signal acquired with the first delay clock timing is different than the signal value of the output signal acquired with the second delay clock timing, the phase detecting section 26 determines that the transition point of the output signal is behind the first delay clock, and therefore increases the count value.

The second delay section 25 may be set to output the second delay clock having a phase that differs from the phase of the first delay clock by half of a cycle of the output signal of the DUT 100. In this way, the transition timing of the second delay clock indicates the timing at the center of the data eye of the output signal, so that the signal value of the output signal can be detected with certainty. As a result, the phase detecting section 26 can accurately detect the phase relation between the transition point of the output signal and the first delay clock.

Although the phase detecting section 26 can detect the phase relation between the transition point of the output signal and the first delay clock with the above method if the signal value of the output signal has been changed, the phase detecting section 26 cannot detect this phase relation if the signal value of the output signal has not been changed. Therefore, if the signal value of the output signal acquired with the second delay clock timing is equal to the signal value of the output signal acquired with a timing that is one cycle earlier than the second delay clock timing, the phase detecting section 26 need not change the count value stored in the storage section 22. Since the phase detecting section 26 does not change the count value if a transition point is not present, the count value can be accurately updated.

The clock generating section 23 may generate the sampling clock having a phase difference of half a cycle of the output signal in relation to the first delay clock. By doing this, the timing comparison section 27 can acquire the output signal at a center of the data eye of the output signal, and can therefore decrease the error in the acceptability judgment. The clock generating section 23 may change the phase difference between the sampling clock and the first delay clock such that the phase scans back and forth over time. In this way, the test apparatus 10 can change the phase at which the output signal is acquired to perform margin testing or the like.

The phase detecting section 26 may increase or decrease the count value stored in the storage section 22 by prescribed amounts, such as a unit of 1. In this case, the storage section 22 may output, as the offset, a value obtained by subtracting a prescribed number of consecutive bits from the least significant bit of the count value. In other words, the storage section 22 may output, as the offset, a value obtained by shifting the count value down by a prescribed number of bits. By doing this, the test apparatus 10 can decrease the gain of the phase adjustment amount in relation to the phase change, and can therefore hold the phase of the sampling clock and the like to be the same in relation to a phase change in which only the lower bits of the count value are changed. As a result, the clock generating section 23 can output a sampling clock with a stable phase by ensuring a sufficient phase margin. The storage section 22 may set the initial value of the count value to be equal to half of the countable range. In this way, the phase can be adjusted over a wide range, even if the phase is ahead of or behind the initial state. The storage section 22 may output, as the offset value, a value obtained by shifting the count value up by a prescribed number of bits. In this way, the storage section 22 can increase the gain of the phase adjustment amount in relation to the phase change, thereby enabling a fast response to the phase of the sampling clock.

Figure 4:
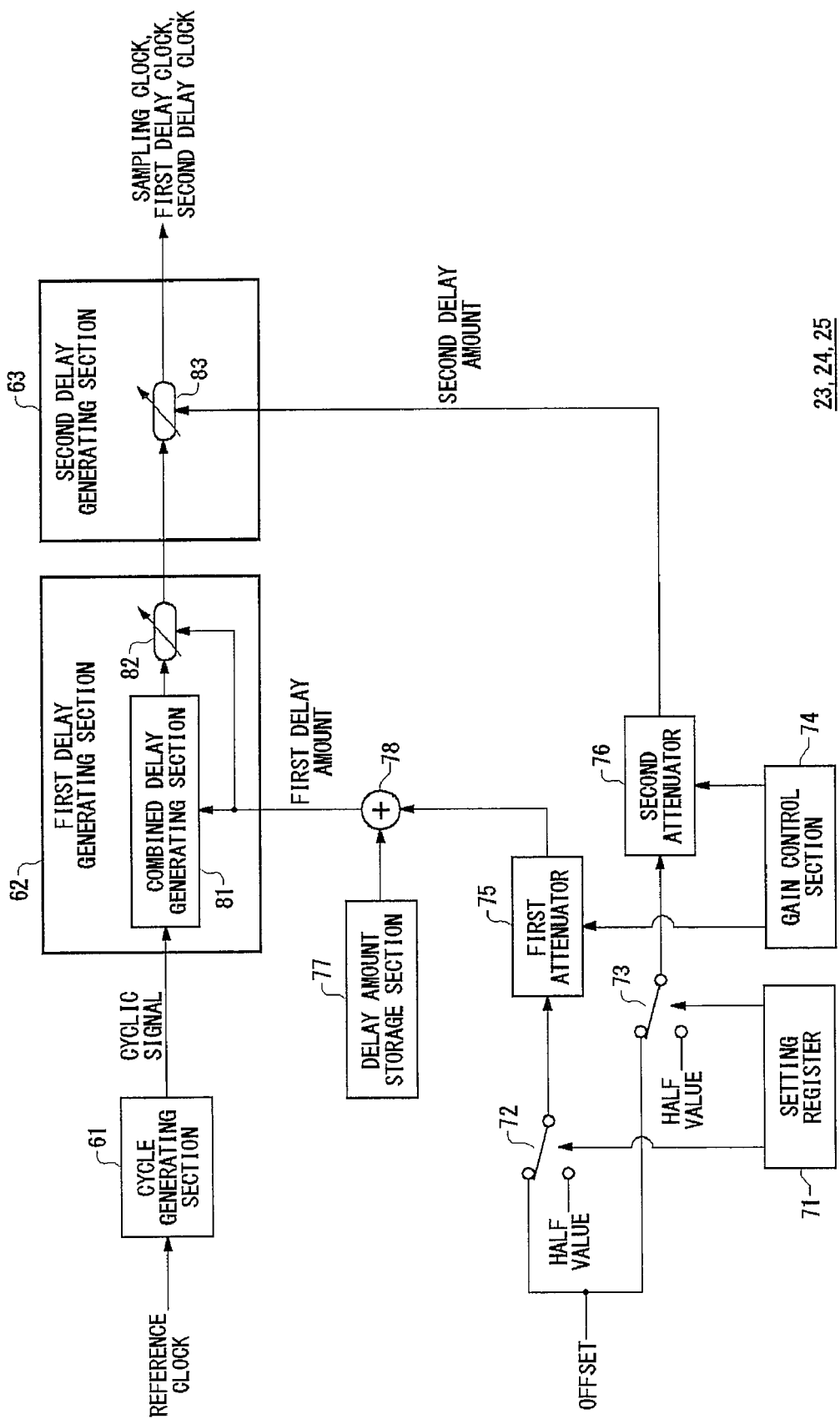
FIG. 4 shows an exemplary configuration of the clock generating section 23, the first delay section 24, and the second delay section 25.

FIG. 4 shows an exemplary configuration of the clock generating section 23, the first delay section 24, and the second delay section 25. Each of the clock generating section 23, the first delay section 24, and the second delay section 25 may include a cycle generating section 61, a first delay generating section 62, a second delay generating section 63, a setting register 71, a first switch 72, a second switch 73, a gain control section 74, a first attenuator 75, a second attenuator 76, a delay amount storage section 77, and an adding section 78.

The cycle generating section 61 outputs a cyclic signal having a cycle identical to that of the output signal of the DUT 100, based on the reference clock. The first delay generating section 62 delays the cyclic signal by a first delay amount, which is obtained by adding a delay amount based on the offset to a delay amount designated to set the cyclic signal to be a clock with a predetermined phase. The first delay generating section 62 may include a combined delay generating section 81 and a first small delay generating element 82. The combined delay generating section 81 delays the cyclic signal by an amount equal to a cycle unit of the reference clock, from among the delay amounts generated by the first delay generating section 62. The first small delay generating element 82 delays the cyclic signal by an amount less than one cycle of the reference clock, from among the delay amounts generated by the first delay generating section 62.

The second delay generating section 63 delays the cyclic signal delayed by the first delay generating section 62, by a second delay amount based on the offset. The second delay generating section 63 may include a second small delay generating element 83. The second small delay generating element 83 delays the cyclic signal delayed by the first delay generating section 62, by an amount less than one cycle of the reference clock. Each of the clock generating section 23, the first delay section 24, and the second delay section 25 outputs the signal from the second delay generating section 63 as the sampling clock, the first delay clock, and the second delay clock, respectively.

The setting register 71 sets whether the respective delay amounts of the first delay generating section 62 and the second delay generating section 63 are changed, according to the offset. The first switch 72 receives the offset and a value indicating that the signal should not be delayed by an amount based on the offset. This value is a half-value within the fluctuation range of the offset, for example. The first switch 72 outputs either the offset or the aforementioned value according to the setting received from the setting register 71. In this way, the first delay generating section 62 delays the cyclic signal by an amount corresponding to the offset if the offset is selected by the first switch 72, and does not delay the cyclic signal by an amount corresponding to the offset if the value indicating that the signal should not be delayed is selected by the first switch 72.

The second switch 73 receives the offset and a value indicating that the signal should not be delayed by an amount based on the offset. This value is a half-value within the fluctuation range of the offset, for example. The first switch 72 outputs either the offset or the aforementioned value according to the setting received from the setting register 71. In this way, the second delay generating section 63 delays the signal output from the first delay generating section 62 by an amount corresponding to the offset if the offset is selected by the first switch 72, and does not delay the signal output from the first delay generating section 62 by an amount corresponding to the offset if the value indicating that the signal should not be delayed is selected by the first switch 72.

The gain control section 74 sets a designated value for the change rate of the delay amount in each of the first delay generating section 62 and the second delay generating section 63 according to the change in the offset. The first attenuator 75 receives the offset via the first switch 72 and attenuates the offset using the gain designated by the gain control section 74. If the first attenuator 75 receives the value indicating the signal should not be delayed by an amount based on the offset instead of the offset, the first attenuator 75 outputs the signal without attenuating this value.

The second attenuator 76 receives the offset via the second switch 73 and attenuates the offset using the gain designated by the gain control section 74. If the second attenuator 76 receives, instead of the offset, the value indicating the signal should not be delayed by an amount based on the offset, the second attenuator 76 outputs the signal without attenuating this value. The first attenuator 75 and the second attenuator 76 may be formed as a right bit shift circuit and may attenuate the offset to be $\frac{1}{2}$, $\frac{1}{4}$, $\frac{1}{8}$, . . . of its original value. The clock generating section 23, the first delay section 24, and the second delay section 25 may each include an amplifier instead of the first attenuator 75 and the second attenuator 76. In this case, the amplifier may include a left bit-shift circuit and amplify the offset to be 2, 4, 8, . . . times its original value.

The offset attenuated by the second attenuator 76, or the value indicating that the signal should not be delayed, is supplied to the second delay generating section 63 as the delay amount. The delay amount storage section 77 stores therein the delay amount designated to set the cyclic signal to be a clock with a predetermined phase, such as a delay amount equal to a cycle unit of the cyclic signal based on the test pattern. The adding section 78 adds the designated delay amount stored in the delay amount storage section 77 to the offset attenuated by the first attenuator 75 or to the value indicating that the signal should not be delayed, and supplies this result to the first delay generating section 62 as the delay amount.

By using the clock generating section 23, the first delay section 24, and the second delay section 25 described above, the first delay generating section 62 can generate a delay based on the offset with a range exceeding one cycle of the reference clock. However, since the offset is transmitted via the adding section 78, the first delay generating section 62 has a relatively slow response time. To solve this problem, the second delay generating section 63 generates a delay based on the offset with a relatively small range that is less than one cycle of the reference clock. Here, the offset is transmitted to the second delay generating section 63 without passing through the adding section 78 and the like, so the response time of the second delay generating section 63 is fast.

In this way, the test apparatus 10 can select the most appropriate delay control for the type of jitter in the output signal of the DUT 100, the content of the test, and the like. For example, the test apparatus 10 selects delay by the first delay generating section 62 when adjusting a phase to correspond to low-speed fluctuation in the output signal caused by temperature change, and selects delay by the second delay generating section 63 when adjusting a phase to correspond to high-speed fluctuation in the output signal caused by current noise.

The clock generating section 23, the first delay section 24, and the second delay section 25 can independently set whether the first delay generating section 62 and the second delay generating section 63 delay the signal. The clock generating section 23, the first delay section 24, and the second delay section 25 adjust the gain for the offset corresponding to the count value stored in the storage section 22. In this way, the test apparatus 10 can set the phase margin to be the most appropriate value, and can set the tracking speed according to the content of the test.

Figure 5:
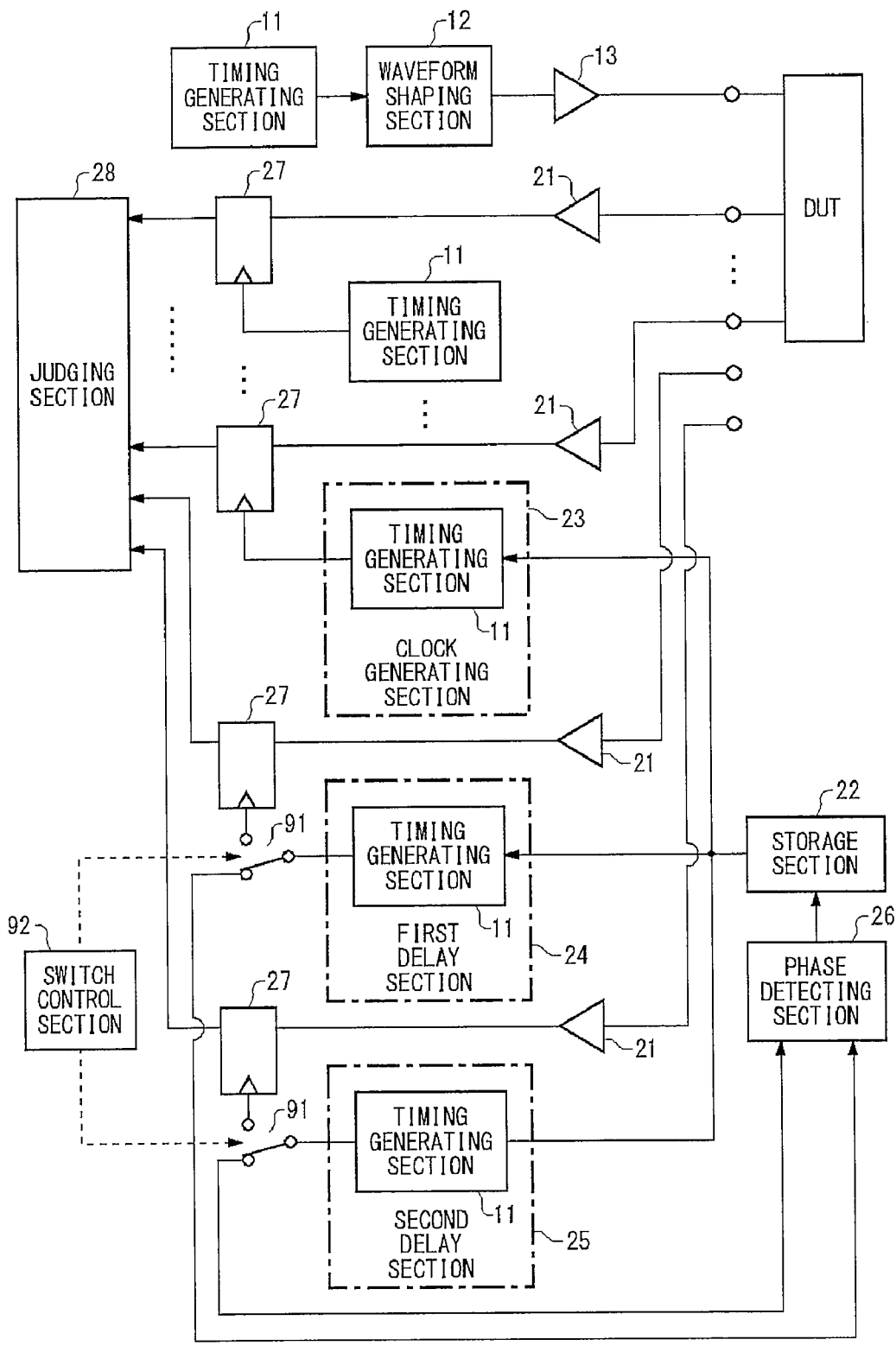
FIG. 5 shows a configuration of the test apparatus 10 according to a modification of the present embodiment, along with the DUT 100.

FIG. 5 shows a configuration of the test apparatus 10 according to a modification of the present embodiment, along with the DUT 100. The components of the test apparatus 10 shown in FIG. 5 that adopt substantially the same function and configuration as the components shown in FIG. 1 are given the same reference numerals, and the following description omits all but differing points.

The test apparatus 10 of the present modification is provided with a plurality of switching sections 91, a plurality of level comparators 21, a plurality of timing comparison sections 27, switching sections 91, and a switch control section 92. The switching sections 91 each correspond to one of the two ore more terminals of the DUT 100 and output a timing pulse obtained by delaying the reference clock. The level comparators 21 binarize the output signal of the DUT 100. The timing comparison sections 27 acquire the output signal of the DUT 100 output through the level comparators 21, based on the timing pulse output by the timing generator 11. The switch control section 92 controls the plurality of switching sections 91.

The switching sections 91 are switched on or off to use the timing generator 11 corresponding to a terminal that does not receive the output signal from the DUT 100 as at least one of the clock generating section 23, the first delay section 24, and the second delay section 25 corresponding to a terminal that receives the output signal from the DUT 100. For example, the switching sections 91 connect the phase detecting section 26 to the output signal of two timing generators 11 provided to correspond to terminals that do not receive the output signal from the DUT 100. In this way, the switching sections 91 cause these two timing generators 11 to function as the first delay section 24 and the second delay section 25. The switch control section 92 controls the switching of the switching sections 91. In this way, the test apparatus 10 of the present modification can effectively utilize the materials already provided to the test apparatus 10 to configure a more efficient apparatus.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A test apparatus that tests a device under test, comprising:
   a storage section that stores a count value for adjusting a phase of a sampling clock indicating a timing of acquiring an output signal of the device under test;
   a clock generating section that generates the sampling clock indicating the timing of acquiring the output signal of the device under test, based on an offset corresponding to the count value and on a reference clock of the test apparatus;
   a first delay section that outputs a first delay clock having a frequency equal to the frequency of the sampling clock and a preset phase difference in relation to the sampling clock, based on the reference clock and the offset;
   a phase detecting section that has an input end connected to the device under test, an input end connected to an output side of the first delay section, and an output end connected to an input side of the storage section, the phase detecting section detecting a phase difference between the first delay clock and a transition point of the output signal of the device under test, and changing the count value in a direction that decreases the phase difference;
   a timing comparison section that has an input end connected to the device under test and an input end connected to an output end of the clock generating section, the timing comparison section acquiring the output signal of the device under test according to a transition timing of the sampling clock; and
   a judging section that has an input end connected to an output end of the timing comparison section, and that judges acceptability of the output signal of the device under test by comparing the output signal acquired by the timing comparison section to an expected value.

2. The test apparatus according to claim 1, further comprising a second delay section that outputs a second delay clock having a frequency equal to the frequency of the first delay clock and having a preset phase difference that is less than one cycle of the first delay clock, in relation to the first delay clock, wherein the phase detecting section includes:
   a first flip-flop that acquires the output signal of the device under test according to a transition timing of the first delay clock;
   a second flip-flop that acquires the output signal of the device under test according to a transition timing of the second delay clock; and
   a count control section that increases the count value stored in the storage section if a signal value acquired by the first flip-flop is different from a signal value acquired by the second flip-flop, and decreases the count value stored in the storage section if the signal value acquired by the first flip-flop is the same as the signal value acquired by the second flip-flop.

3. The test apparatus according to claim 2, wherein
the phase detecting section further includes a third flip-flop that acquires the signal value acquired by the second flip-flop, according to a transition timing of the second delay clock, and
the count control section does not change the count value if the signal value acquired by the second flip-flop is equal to the signal value acquired by the third flip-flop.

4. The test apparatus according to claim 2, wherein
the second delay section is set to output the second delay clock being delayed in relation to the first delay clock by half a cycle of the output signal of the device under test.

5. The test apparatus according to claim 1, further comprising an attenuator that outputs, as the offset, a value obtained by shifting the count value down by a prescribed number of bits.

6. The test apparatus according to claim 1, further comprising an attenuator that outputs, as the offset, a value obtained by shifting the count value up by a prescribed number of bits.

7. The test apparatus according to claim 1, wherein
the clock generating section and the first delay section each include:
a cycle generating section that outputs a cyclic signal having a cycle equal to the cycle of the output signal of the device under test, based on the reference clock;
a first delay generating section that delays the cyclic signal by an amount obtained by adding a delay amount based on the offset to a delay amount designated to set the cyclic signal to be a clock with a predetermined phase; and
a second delay generating section that delays the cyclic signal delayed by the first delay generating section, by an amount based on the offset, and
the signal output by the second delay generating section is set as the sampling clock or the first delay clock.

8. The test apparatus according to claim 7, wherein
each of the clock generating section and the first delay section further includes a setting register that sets whether the delay amount of each of the first delay generating section and the second delay generating section changes according to the offset.

9. The test apparatus according to claim 7, wherein
each of the clock generating section and the first delay section further includes a gain control section that sets a designated value for a change rate of the delay amount of each of the first delay generating section and the second delay generating section corresponding to a change in the offset.

10. A method for testing a device under test with a test apparatus, comprising the steps of:
storing, in a storage section of the test apparatus, a count value for adjusting a phase of a sampling clock indicating a timing of acquiring an output signal of the device under test;
generating, by a clock generating section of the test apparatus, the sampling clock indicating the timing of acquiring the output signal of the device under test, based on an offset corresponding to the count value and a reference clock of the test apparatus;
outputting, by a first delay section of the test apparatus, a first delay clock having a frequency equal to the frequency of the sampling clock and a preset phase difference in relation to the sampling clock, based on the reference clock and the offset;
detecting, by a phase detecting section of the test apparatus, a phase difference between the first delay clock and a transition point of the output signal of the device under test, and changing the count value in a direction that decreases the phase difference;
acquiring, by a timing comparison section of the test apparatus, the output signal of the device under test according to a transition timing of the sampling clock; and
judging, by a judging section of the test apparatus, acceptability of the output signal of the device under test by comparing the output signal acquired at the output signal acquiring step to an expected value.

11. The method according to claim 10, further comprising outputting, by a second delay section of the test apparatus, a second delay clock having a frequency equal to the frequency of the first delay clock and having a preset phase difference that is less than one cycle of the first delay clock, in relation to the first delay clock, wherein the step of detecting the phase difference includes:
acquiring, by a first flip-flop, the output signal of the device under test according to a transition timing of the first delay clock;
acquiring, by a second flip-flop, the output signal of the device under test according to a transition timing of the second delay clock; and
increasing the count value stored in the storage section if a signal value acquired by the first flip-flop is different from a signal value acquired by the second flip-flop, and decreasing the count value stored in the storage section if the signal value acquired by the first flip-flop is the same as the signal value acquired by the second flip-flop.

12. The method according to claim 10, wherein
the steps of generating the sampling clock and outputting the first delay clock each include:
outputting a cyclic signal having a cycle equal to the cycle of the output signal of the device under test, based on the reference clock;
delaying, by a first delay generating section, the cyclic signal by an amount obtained by adding a delay amount based on the offset to a delay amount designated to set the cyclic signal to be a clock with a predetermined phase; and
delaying, by a second delay generating section, the cyclic signal delayed by the first delay generating section, by an amount based on the offset, and
the signal output by the second delay generating section is set as the sampling clock or the first delay clock.

13. A non-transitory computer readable medium storing thereon a program that, when executed, causes the computer to function as:
a storage module that stores a count value for adjusting a phase of a sampling clock indicating a timing of acquiring an output signal of the device under test;
a clock generating module that generates the sampling clock indicating the timing of acquiring the output signal of the device under test, based on an offset corresponding to the count value and on a reference clock of the test apparatus;
a first delay module that outputs a first delay clock having a frequency equal to the frequency of the sampling clock and a preset phase difference in relation to the sampling clock, based on the reference clock and the offset;
a phase detecting module that detects a phase difference between the first delay clock and a transition point of the output signal of the device under test, and changes the count value in a direction that decreases the phase difference;
a timing comparison module that acquires the output signal of the device under test according to a transition timing of the sampling clock; and a judging module that judges acceptability of the output signal of the device under test by comparing the output signal acquired by the timing comparison section to an expected value.

14. The non-transitory computer readable medium according to claim 13, wherein the program, when executed, causes the computer to further function as a second delay module that outputs a second delay clock having a frequency equal to the frequency of the first delay clock and having a preset phase difference that is less than one cycle of the first delay clock, in relation to the first delay clock, wherein the phase detecting module includes:
   a first flip-flop that acquires the output signal of the device under test according to a transition timing of the first delay clock;
   a second flip-flop that acquires the output signal of the device under test according to a transition timing of the second delay clock; and
   a count control section that increases the count value stored in the storage module if a signal value acquired by the first flip-flop is different from a signal value acquired by the second flip-flop, and decreases the count value stored in the storage module if the signal value acquired by the first flip-flop is the same as the signal value acquired by the second flip-flop.

15. The non-transitory computer readable medium according to claim 13, wherein
   the clock generating module and the first delay module each include:
   a cycle generating section that outputs a cyclic signal having a cycle equal to the cycle of the output signal of the device under test, based on the reference clock;
   a first delay generating section that delays the cyclic signal by an amount obtained by adding a delay amount based on the offset to a delay amount designated to set the cyclic signal to be a clock with a predetermined phase; and
   a second delay generating section that delays the cyclic signal delayed by the first delay generating section, by an amount based on the offset, and
   the signal output by the second delay generating section is set as the sampling clock or the first delay clock.

* * * * *